United States Patent
Trauth et al.

(10) Patent No.: US 9,350,328 B1
(45) Date of Patent: May 24, 2016

(54) RING OSCILLATOR CIRCUIT AND METHOD OF REGULATING AGGREGATE CHARGE STORED WITHIN CAPACITIVE LOADING THEREFOR

(71) Applicant: Freescale Semiconductor, Inc., Austin, TX (US)

(72) Inventors: Gerhard Trauth, Muret (FR); Arnaud Lachaise, Toulouse (FR); Yean Ling Teo, Goyrans (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/755,119

(22) Filed: Jun. 30, 2015

(30) Foreign Application Priority Data

Jan. 27, 2015 (WO) .................. PCT/IB2015/000337

(51) Int. Cl.
*H03K 3/03* (2006.01)
*H03K 3/014* (2006.01)
*H03K 3/012* (2006.01)

(52) U.S. Cl.
CPC ................ *H03K 3/012* (2013.01); *H03K 3/014* (2013.01); *H03K 3/03* (2013.01); *H03K 3/0315* (2013.01)

(58) Field of Classification Search
CPC ....... H03K 3/012; H03K 3/03; H03K 3/0315; H03K 3/354; H03K 3/014; H03B 5/24; H03B 5/06
USPC ........................... 331/57, 111, 143
See application file for complete search history.

(56) References Cited

U.S. PATENT DOCUMENTS

| 3,914,711 | A | * | 10/1975 | Carlson ................... | H03K 3/027 331/108 D |
| 4,286,233 | A | * | 8/1981 | Kucharewski ............ | H03K 3/03 331/108 R |
| 4,365,212 | A | * | 12/1982 | Gentile ................ | H03K 3/0231 331/111 |
| 7,859,354 | B1 | | 12/2010 | Chen et al. | |
| 2008/0007355 | A1 | | 1/2008 | Nakashima | |
| 2011/0309886 | A1 | | 12/2011 | Moussavi et al. | |

FOREIGN PATENT DOCUMENTS

JP 11074763 A * 3/1999

\* cited by examiner

*Primary Examiner* — Ryan Johnson
(74) *Attorney, Agent, or Firm* — Charlene R. Jacobsen

(57) ABSTRACT

A ring oscillator circuit comprising a plurality of stages operably coupled output-to-input in a ring configuration. A frequency tuning stage comprises an inverting logic gate and a delay component. The delay component comprises a first capacitive component comprising a first terminal operably coupled to an output of the inverting logic gate and a second terminal operably coupled to a first reference voltage at least when the ring oscillator is disabled. The delay component further comprises a further capacitive component comprising a first terminal operably coupled to the output of the inverting logic gate and a second terminal selectively couplable to the first reference voltage and a second reference voltage. The second terminal of the further capacitive component is arranged to be operably coupled to the first reference voltage when the ring oscillator is enabled, and operably coupled to the second reference voltage when the ring oscillator is disabled.

17 Claims, 9 Drawing Sheets

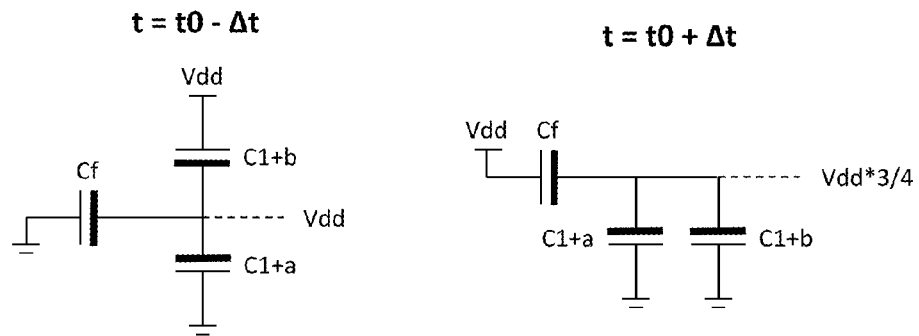
FIG. 9
FIG. 10
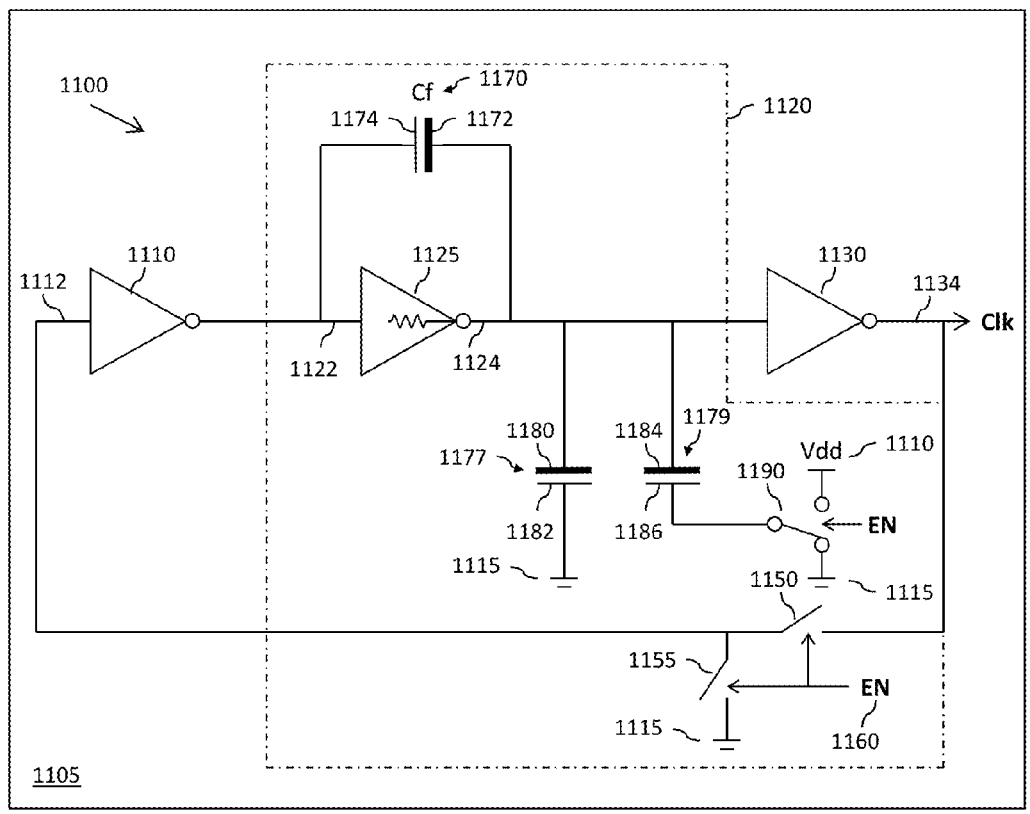
FIG. 11

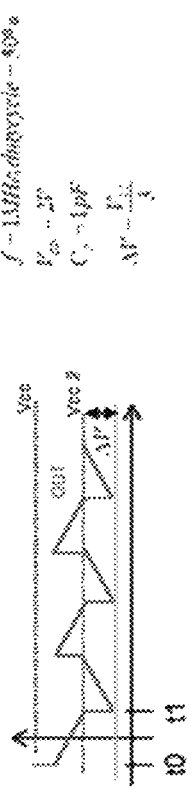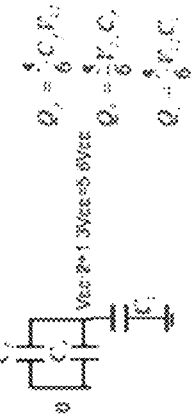
FIG. 17 — Proof of Concept: example for XOR slitted Cf

RING OSCILLATOR CIRCUIT AND METHOD OF REGULATING AGGREGATE CHARGE STORED WITHIN CAPACITIVE LOADING THEREFOR

FIELD OF THE INVENTION

This invention relates to a ring oscillator circuit and a method of regulating an aggregate charge stored within a capacitive loading of a delay component for a frequency tuning stage of a ring oscillator circuit.

BACKGROUND OF THE INVENTION

In the field of battery powered consumer applications, there is a continual drive to reduce the cost and power consumption of such applications. Reducing the die size of integrated circuit devices used within such battery powered consumer applications is one important technique for reducing costs.

Many battery powered consumer applications require clock generator circuits to generate timing reference signals within a mixed signal integrated circuit device. For example an accelerometer integrated circuit device may comprise a MEMS (micro-electro-mechanical system) sensor for sensing acceleration, and a mixed signal integrated circuit for transforming the mechanical acceleration into an electrical signal. The electrical image of acceleration is measured through an ADC (analogue to digital converter), followed by digital data processing. The processed data is then provided to a processor.

The time frame for measuring and converting the acceleration is fixed (e.g. 100 us), while the data rate may be variable (e.g. 0.1 Hz to 1 kHz). During the 100 us measure and convert time frame, a 'high frequency' timing reference signal (e.g. 1 MHz) is required to enable the acceleration to be measured, converted (from analogue to digital) and processed within the time frame. This high frequency timing signal is only enabled during the measure and convert time frame. A second 'low frequency' reference timing signal (e.g. 32 kHz), which is 'always on' and when the high frequency timing signal is not enabled. In this manner, the high frequency timing signal is only used when required, with the integrated circuit components being switched to the low frequency reference timing signal at other times to reduce power consumption.

Within such a mixed signal integrated circuit device, the handover between two reference timing signals must be performed in an expeditious manner to minimize any delay which could impact the overall time scaling. Clock generators are typically realised through oscillator circuits. There are various different types of oscillator circuits. Relaxation oscillators have a short start-up (enabling) time but they are usually larger in terms of die size and consume more current than, say, ring oscillators. Furthermore, relaxation oscillators potentially generate kickback noise due to the fact that they compare a ramp with a reference signal. This comparison is done with a comparator (not needed in ring oscillators) whose inputs are the reference and the ramp. Once the ramp reaches the reference the comparator changes state, which results in changes around the ramp node. This change can be coupled back to the reference node through parasitics around the comparator input, and thus can perturb the reference. Usually the reference is shared with other circuits who could suffer due to this kick-back noise. Accordingly, despite their short start-up (enabling) time, relaxation oscillators are not suitable for use within many integrated circuit devices.

Ring oscillators do not suffer from the potential to generate kickback noise in the same way as relaxation oscillators, and are usually smaller in terms of die size and consume less current than relaxation oscillators. As such, ring oscillators are generally the preferred type of ring oscillator for use within many integrated circuit devices. However, ring oscillators have the drawback that they can suffer from large start-up (enable) times, requiring earlier start-up of the ring oscillators in order to ensure they are ready for handover in time. The need to start-up the ring oscillators early reduces the effectiveness of using different frequency reference timing signals within a mixed signal integrated circuit to reduce power consumption.

SUMMARY OF THE INVENTION

The present invention provides a ring oscillator circuit and a method of regulating an aggregate charge stored within a capacitive loading of a delay component for a frequency tuning stage of a ring oscillator circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIGS. 7 to 10 schematically illustrate voltages across capacitances within the frequency tuning stage illustrated in FIGS. 4 and 5.

FIG. 11 illustrates a simplified circuit diagram of an example of a ring oscillator circuit.

FIG. 17 illustrates a proof of concept for the example ring oscillator circuit illustrated in FIG. 16.

DETAILED DESCRIPTION OF THE PREFERRED EMBODIMENTS

Figure 1:
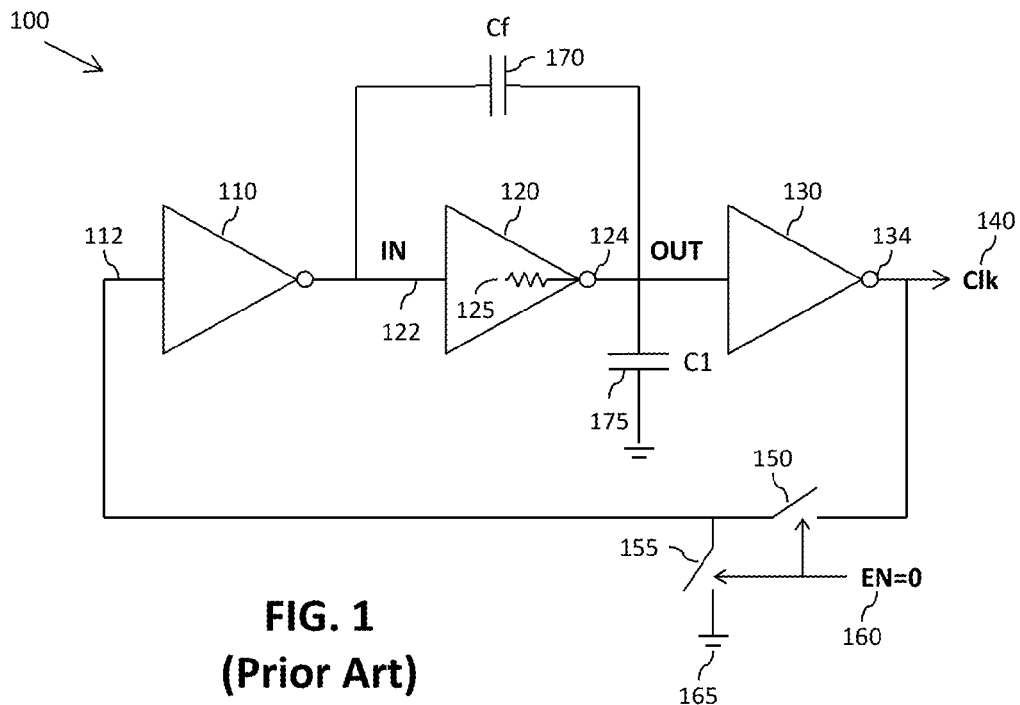
FIGS. 1 and 2 schematically illustrate simplified circuit diagrams of conventional ring oscillators.

The present invention will now be described with reference to the accompanying drawings. However, it will be appreciated that the present invention is not limited to the specific examples herein described and as illustrated in the accompanying drawings, and that various modifications and or combinations of the illustrated and described examples may be made without departing from the inventive concept. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to some examples of one aspect of the present invention, there is provided a ring oscillator circuit comprising a plurality of stages operably coupled output-to-input in a ring configuration. At least one of the stages of the ring oscillator circuit comprises a frequency tuning stage, the at least one frequency tuning stage comprising an inverting logic gate and a delay component. The delay component comprises: a first capacitive component comprising a first terminal operably coupled to an output of the inverting logic gate and a second terminal operably coupled to a first reference voltage at least when the ring oscillator is disabled, the first reference voltage comprising one of a high reference voltage and a low reference voltage; and at least one further capacitive component comprising a first terminal operably coupled to the output of the inverting logic gate and a second terminal selectively couplable to the first reference voltage and a second reference voltage, the second reference voltage comprising the other of the high reference voltage and the low reference voltage. The second terminal of the at least one further capacitive component is arranged to be operably coupled to the first reference voltage when the ring oscillator is enabled, and operably coupled to the second reference voltage when the ring oscillator is disabled.

In this manner, and as described in greater detail below, the aggregated charge stored within the capacitive loading of the delay element of the frequency tuning stage may be regulated when the ring oscillator is disabled. Furthermore, a redistribution of the (regulated) aggregated charge stored within the capacitive loading may be achieved that reduces, and potentially eliminates, overshoot/undershoot at the output of the frequency tuning stage. As a result, the delay between the ring oscillator being enabled and the time at which the ring oscillator starts running at its designated frequency may be significantly reduced, and potentially eliminated altogether. Thus, the present invention enables an oscillator circuit to be achieved that comprises the relatively small die size and current consumption of a ring oscillator, but without the large start-up (enable) times that conventional ring oscillator circuit suffer from.

Referring now to FIG. 1, there is schematically illustrated a simplified circuit diagram of a conventional ring oscillator 100. The ring oscillator 100 comprises an odd number (three in FIG. 1) of inverters 110, 120, 130 operably coupled output-to-input in a ring configuration. An output 134 of a final inverter 130 in the ring oscillator 100 is used to provide a reference timing signal (Clk) 140 output by the ring oscillator 100.

A first switching element 150 is provided within the ring oscillator 100 between the output 134 of the final inverter 130 and an input 112 of a first inverter 110 in the ring oscillator 100. The first switching element 150 is controlled by an enable signal 160. The enable signal 160 is arranged to configure the first switching element 150 into a closed state (whereby the first switching element 150 operably couples the output 134 of the final inverter 130 to the input 112 of the first inverter 110) when comprising a first logical state (e.g. a logical '1') and to configure the first switching element 150 into an open state (whereby the first switching element 150 isolates the output 134 of the final inverter 130 from the input 112 of the first inverter 110) when comprising a second logical state (e.g. a logical '0'). In this manner, the enable signal 160 is used to enable and disable the ring oscillator 100 by configuring the first switching element 150 into a closed and open state respectively.

A second switching element 155 is operably coupled between the input 112 of the first inverter 110 and a reference voltage signal, which in the illustrated circuit comprises a ground signal 165 providing a logical '0' reference state. The second switching element 155 is also controlled by the enable signal 160. The enable signal 160 is arranged to configure the second switching element 155 into an open state (whereby the second switching element 155 isolates the input 112 of the first inverter 110 from the reference voltage signal 165) when comprising the first logical state (e.g. a logical '1') and to configure the second switching element 155 into a closed state (whereby the second switching element 155 operably couples the input 112 of the first inverter 110 to the reference voltage signal 165) when comprising the second logical state (e.g. a logical '0'). In this manner, the enable signal 160 is arranged to operably couple the input 112 of the first inverter 110 to the reference voltage signal 165 when the ring oscillator 100 is disabled in order to force the input 112 of the first inverter 110 to an initial (starting) logical state defined by the reference voltage signal 165 (i.e. a logical '0' state in FIG. 1).

A resistance 125 is illustrated within the second inverter 120 of the ring oscillator 100, this resistance 125 representing the fact that the output of this inverter is limited in terms of its ability to supply current. This resistance in conjunction with capacitive loading, illustrated by way of capacitances Cf 170 and C1 175 in FIG. 1, provides a delay element within the ring oscillator 100, which defines the oscillating frequency of the ring oscillator 100. Accordingly, the second inverter 120 in the illustrated implementations may be considered as a frequency tuning stage within the ring oscillator 100.

Figure 2:
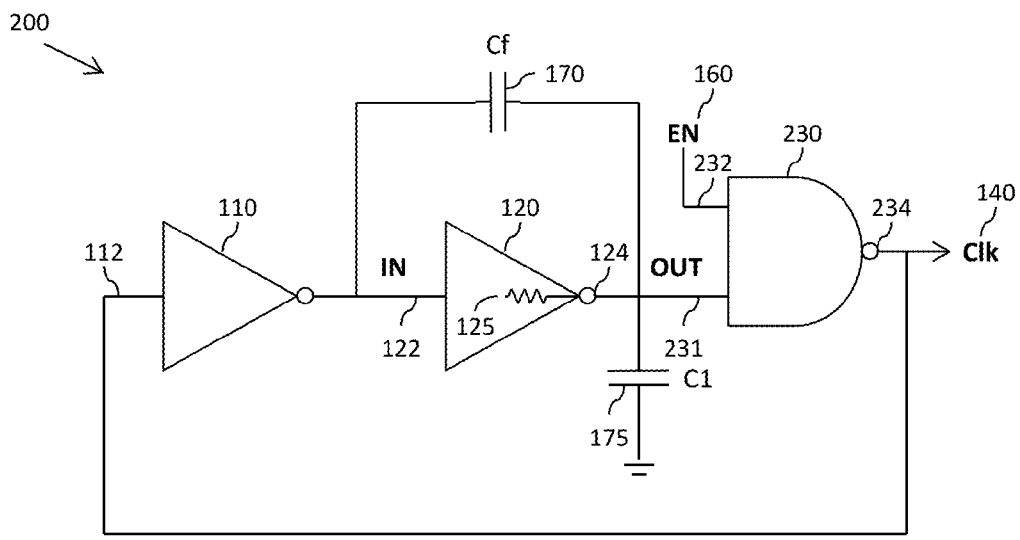

FIG. 2 schematically illustrates a simplified circuit diagram of an alternative implementation of a conventional ring oscillator 200. In this alternative implementation, the ring oscillator 200 comprises an odd number (three in FIG. 2) of inverting logic gates 110, 120, 230 operably coupled output-to-input in a ring configuration. The first two inverting logic gates 110, 120 comprise inverters, whilst in the final logic gate 230 comprises a NAND logic gate. A first input 231 of the NAND gate 230 is operably coupled to an output 124 of the preceding inverter 120 within the ring oscillator 200. A second input 232 of the NAND gate 230 is operably coupled to the enable signal 160. An output 234 of the NAND gate 230 is used to provide a reference timing signal (Clk) 140 output by the ring oscillator 200.

In this manner, when the enable signal 160 is configured to comprise a logical '0', the output 234 of the NAND gate 230 is held at a logical '1', irrespective of the signal received at the first input 231 of the NAND gate 230. In this manner, the enable signal 160 may be used to disable the ring oscillator 200 by configuring the enable signal 160 to comprise a logical '0'. Configuring the enable signal 160 to comprise a logical '0' also forces the input 112 of the first inverter 110 (operably coupled to the output of the NAND gate 230) to an initial (starting) logical state of a logical '1'.

Conversely, when the enable signal 160 is configured to comprise a logical '1', the output 234 of the NAND gate 230 will comprise the inverse of the signal received at the first input 231 of the NAND gate 230, thereby enabling the ring oscillator 200.

Figure 3:
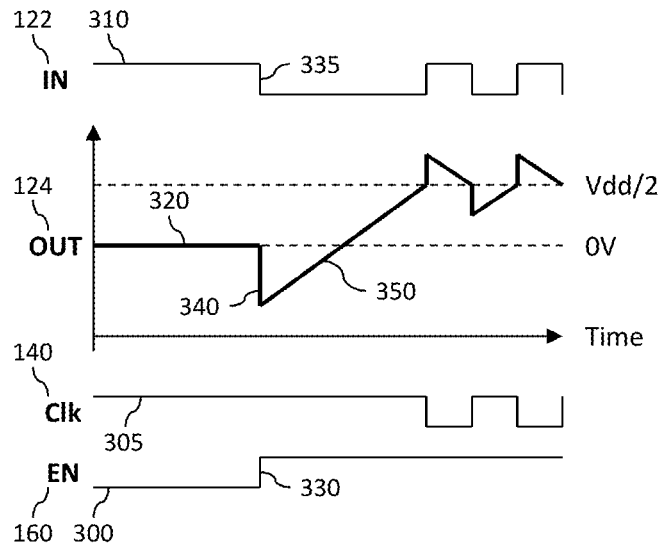
FIG. 3 illustrates a simplified graph showing voltage over time for the conventional ring oscillator illustrated in FIG. 1.

FIG. 3 illustrates a simplified graph showing voltage over time for the conventional ring oscillator 100 illustrated in FIG. 1. When the conventional ring oscillator 100 is in an OFF mode, i.e. when the enable signal 160 has been configured to comprise a logical '0', as illustrated at 300 in FIG. 3, the ring oscillator 100 is disabled and the output 140 of the ring oscillator 100 is held at a logical '1' state, as illustrated at 305. The input 112 of the first inverter 110 is forced to a starting logical state of a logical '0' by the ground plane 165 via second the switching element 155. The logical '1' output by the first inverter 110 is received at the input 122 of the second inverter 120, as indicated at 310 in FIG. 3, resulting in a voltage at the input 122 of the second inverter 120 equal to a high voltage supply Vdd. In response to the logical '1' received at its input 122, the second inverter 120 configures its output 124 to comprise a logical '0', resulting in a voltage at the output 124 of the second inverter 120 equal to a low voltage supply, e.g. 0V, as indicated at 320. As a result, the capacitance Cf 170 is charged to −Vdd, whilst the capacitance C1 175 is discharged.

When the enable signal 160 is subsequently configured to comprise a logical '1' to enable the ring oscillator 100, as indicated at 330 in FIG. 3, the signal at the input 112 of the first inverter 110 changes from a logical '0' to a logical '1', causing the first inverter 110 to reconfigure its output 114 to a logical '0' state. As a result, the voltage level at the input of the second inverter 120 drops from Vdd to 0V, as indicated at 335 in FIG. 3. When the voltage level at the input 122 of the second inverter 120 drops to 0V, the −Vdd charge stored within the capacitance Cf 170 pulls the voltage at the output 124 of the second inverter 120 down, causing an undershoot of the voltage level at the output 124 of the second inverter 120, as indicated at 340 in FIG. 3. In particular, the voltage at the output 124 of the second inverter 120 becomes −k*Vdd, where k defines the ratio of the capacitances Cf 170 and C1 175. A part of the charge stored in the flying capacitance Cf 170 will transfer to the capacitance C1 175, depending on the value of k. For example, if Cf=C1, half the (negative) charge stored in the flying capacitance Cf 170 will transfer to the capacitance C1 175 resulting in −Vdd/2 at the output 124 of the second inverter 120.

In order for the ring oscillator circuit 100 to run (oscillate) at its designated frequency, the voltage at the output 124 of the second inverter 120 is required to reach a 'transition voltage' for the next stage in the ring oscillator 100 (i.e. the voltage level at which the third inverter 130 will treat the signal at its input as transitioning from, in the illustrated example, a logical '0' to a logical '1'). In the illustrated example, the transition voltage is considered to be approximately Vdd/2. Accordingly, to enable the ring oscillator circuit 100 to run (oscillate) at its designated frequency, the deficit in charge at the output 124 of the second inverter 120 is required to be compensated for sufficiently to increase the voltage at the output 124 of the second inverter from −k*Vdd to Vdd/2, as indicated at 350. This need for the second inverter 120 to charge the capacitances 170, 175 results in a significant delay between the time the enable signal 160 is configured to enable the ring oscillator 100 and the time that the ring oscillator 100 is running at its designated frequency; and thus is a primary cause of the large start-up (enable) times for ring oscillators.

In alternative implementations, such as the conventional ring oscillators 200 illustrated in FIG. 2, the input 112 of the first inverter 110 is held at a starting logical state of a logical '1' when the ring oscillator 200 is in an OFF mode. In such a state, the first inverter 110 drives the input of the second inverter 120 to a logical '0', resulting in a voltage level at the input 122 of the second inverter 120 equal to Vss (e.g. 0V). The second inverter 120 drives its output 124 to a logical '1', resulting in a voltage level at the output 124 of the second inverter 120 equal to Vdd. As a result, both of the capacitances Cf 170 and Ca 175 are charged to Vdd by the logical '1' at the output 124 of the second inverter 120.

When the ring oscillator 100, 200 is enabled, the input node 122 of the second inverter 120 will be driven to a logical '1', resulting in a voltage level at the input 122 of the second inverter 120 equal to Vdd, and causing the second inverter 120 to drive its output 124 to a logical '0'. However, the charges stored in the capacitances Cf 170 and Ca 175 will be stacked on top of the Vdd voltage level at the input 122 of the second inverter 120, causing a voltage overshoot at the output node 124 of the second inverter 120, comparable to the undershoot 350 illustrated in FIG. 3 for the implementation illustrated in FIG. 1.

This excess charge is required to be evacuated to enable the ring oscillator circuit 200 to run (oscillate) at its designated frequency. In a corresponding manner to the need to compensate for the charge deficit described above in relation to FIGS. 1 and 3, this need to evacuate the excess charge results in a significant delay between the time the ring oscillator 200 is enabled and the time that the ring oscillator is running at its designated frequency.

As recognised by the inventors, the delay between the time the ring oscillator is enabled and the time that the ring oscillator is running at its designated frequency may be significantly reduced, and potentially even eliminated, by controlling the charges within the capacitances Cf 170, C1 175 when the ring oscillator is disabled such that upon the ring oscillator being enabled excess/deficit charge at the output 124 of, in the illustrated implementations, the second inverter 120 is substantially avoided.

Figure 4:
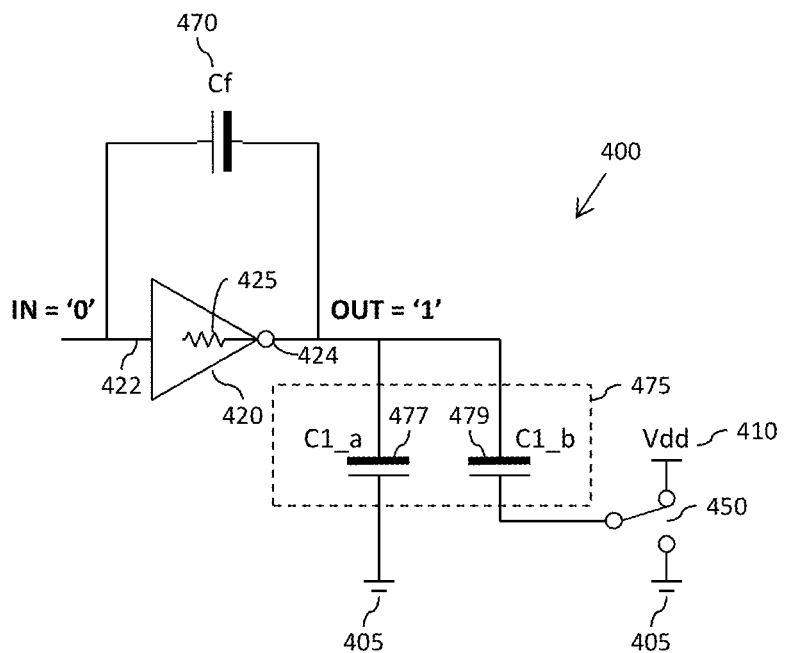
FIGS. 4 and 5 schematically illustrate a simplified circuit diagram of a frequency tuning stage for a ring oscillator.
Figure 5:
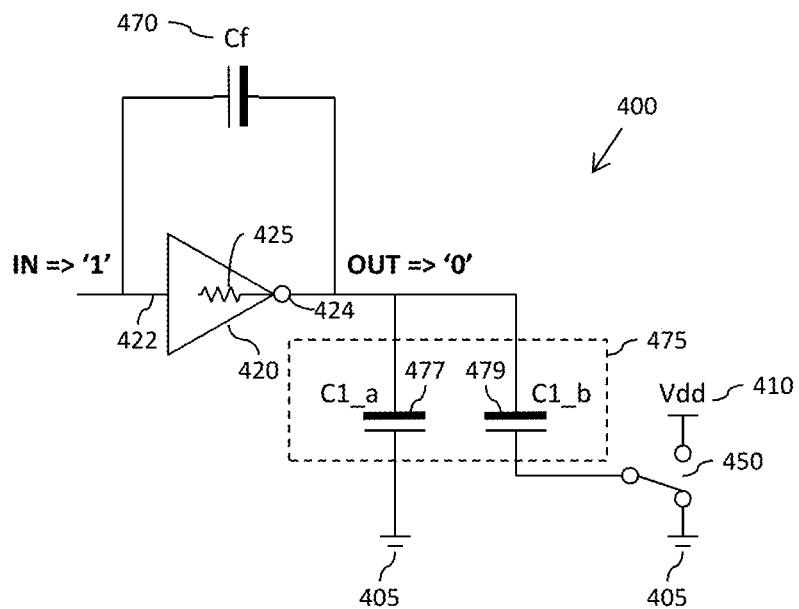

FIGS. 4 and 5 schematically illustrate a simplified circuit diagram of a frequency tuning stage 400 for a ring oscillator (not shown) comprising an inverter 420 and a delay element. In the illustrated example, the delay element of the frequency tuning stage 400 comprises the resistance 425 illustrated within the inverter 420, and a capacitive loading of the output 424 of the inverter 420. This resistance 425 represents the fact that the output of the inverter 420 is limited in terms of its ability to supply current. The capacitive loading comprises a first capacitive element C1 475 arranged to operably couple the output 424 of the inverter 420 to a reference voltage when the ring oscillator is enabled, such as a ground plane 405. In the illustrated example, the capacitive loading further comprises a flying capacitive element Cf 470 operably coupled across the inverter 420, between the input 422 and the output 424 of the inverter 420. The limited current (represented by the resistance 425) in conjunction with the capacitive loading, illustrated by way of capacitive elements Cf 470 and C1 475 in FIG. 4, provides a delay element within the ring oscillator, which defines the designated oscillating frequency of the ring oscillator.

In submicron technologies it is possible to reach oscillating frequencies in the order of hundreds of megahertz with ring oscillators. For ring oscillators operating in this region of frequency, a capacitive element operably coupled between the output of the inverter and a reference voltage (e.g. ground, Vss or Vdd), such as the first capacitive element C1 475 illustrated in FIG. 4, is sufficient to enable slight tuning of the operating frequency within this high frequency region. For lower frequency oscillators (e.g. below 40-20 MHz) a significant decrease in frequency is required. To achieve this with a capacitive element operably coupled between the output of the inverter and a reference voltage would require an extremely large capacitance connected between the output of the inverter and the reference voltage. The use of such a large capacitance is undesirable due to the large amount of die space and thus cost required to implement a large capacitance. However, by coupling a flying capacitance across the inverter, such as the flying capacitive element Cf 470 illustrated in FIG. 4, a more effective tuning (i.e. reduction) of the operating frequency of the ring oscillator may be achieved using a much small capacitance.

In the conventional ring oscillator implementations illustrated in FIGS. 1 and 2, the capacitive loading applied to the output 124 of the inverter 120 comprises the flying capacitive element Cf 170 and the further capacitive element C1 175 operably coupled between the output 124 of the inverter 120 and a ground plane. In these conventional implementations, the capacitive element C1 175 is statically coupled in its entirety between the output 124 of the inverter 120 and the ground plane.

However, in the example illustrated in FIG. 4, the capacitive element C1 475 operably coupling the output 424 of the inverter 420 to one or more reference voltages comprises a first capacitive component C1_a 477 arranged to be statically coupled between the output 424 of the inverter 420 and the ground plane 405, and at least one further capacitive component C1_b 479 arranged to be selectively coupled between the output 424 of the inverter 420 and one of the ground plane 405 and a positive voltage source, which in the illustrated example comprises the positive supply voltage Vdd 410.

In FIG. 4, the frequency tuning stage 400 is illustrated when the ring oscillator is disabled, whereby the input 422 of the inverter 420 is held at, say, a logical '0' state, in a similar manner to the second inverter 120 in FIG. 2. Thus, when the ring oscillator is disabled, the input 422 of the inverter 420 is held at a logical '0' state (i.e. comprises a voltage level=0V), and the inverter 420 drives a logical '1' state at its output 424 (comprising a voltage level=Vdd). Accordingly, when the ring oscillator is disabled, the flying capacitance 470 comprises a $\Delta V = Vdd$, resulting in the flying capacitance 470 being charged to Cf*Vdd. Furthermore, when the ring oscillator is disabled, the first capacitive component C1_a 477 comprises a $\Delta V = Vdd$, resulting in the first capacitive component C1_a 477 being charged to C1_a*Vdd.

It is proposed that the further capacitive component C1_b 479 be coupled between the output 424 of the inverter 420 and the positive voltage source, Vdd 410 in the illustrated example, when the ring oscillator is disabled, as illustrated in FIG. 4. In this manner, the further capacitive component C1_b 479 comprises a $\Delta V = 0V$, resulting in the further capacitive component C1_b 479 being discharged when the ring oscillator is disabled.

Upon the ring oscillator being subsequently enabled, as illustrated in FIG. 5, it is proposed that the further capacitive component C1_b 479 be switched to being coupled between the output 424 of the inverter 420 and the ground plane 405. Accordingly, upon the ring oscillator being enabled and the input 422 of the inverter 420 changing to a logical '1' state, the voltage level at the input 422 of the inverter 420 rises to Vdd.

In the conventional implementation illustrated in FIG. 2, when the voltage level at the input 122 of the second inverter 120 drops to 0V, the −Vdd charge stored within the capacitance Cf 170 pulls the voltage at the output 124 of the second inverter 120 down, causing an overshoot of the voltage level at the output 124 of the second inverter 120, corresponding to the undershoot indicated at 340 in FIG. 3.

However, in the example illustrated in FIG. 5, because the further capacitive component C1_b 479 has been discharged when the ring oscillator is disabled, at least some of the charge stored within the flying capacitance 470 is able to be absorbed by the further capacitive component C1_b 479, and the aggregated charge redistributed across all three of the capacitances 470, 477, 479. By appropriate sizing of the capacitances 470, 477, 479, redistribution of the aggregated charge stored within the flying capacitance 470 and the capacitive components C1_a 477 and C1_b 479 may be achieved such that a resulting voltage at the output 424 of the inverter 420 substantially immediately upon the ring oscillator being enabled allows the ring oscillator to run at its designated frequency substantially without any delay.

Figure 6:
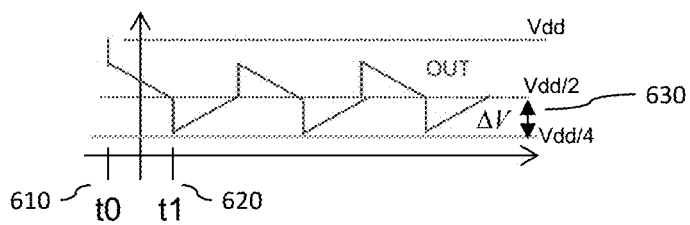
FIG. 6 illustrates a simplified graph showing an example of voltage over time for the output of the frequency tuning stage illustrated in FIGS. 4 and 5.

FIG. 6 illustrates a simplified graph showing an example of voltage over time for the output 424 of the inverter 420 within the frequency tuning stage 400 illustrated in FIGS. 4 and 5. Time t0, indicated at 610, represents the time at which the ring oscillator (not shown) of which the frequency tuning stage 400 forms a part is enabled, and at which the further capacitive component C1_b 479 is switched to being coupled between the output 424 of the inverter 420 and the ground plane 405, as illustrated in FIG. 5. Time t1, indicated at 620, represents the time at which the voltage level at the output 424 of the inverter 420 reaches a 'transition voltage' for the next stage in the ring oscillator (i.e. the voltage level at which the next stage will treat the signal at its input as transitioning from, in the illustrated example, a logical '1' to a logical '0'). In the illustrated example, the transition voltage is considered to be approximately Vdd/2. Upon reaching such a transition voltage at the output 424 of the inverter 420 after the ring oscillator has been enabled at time T0, the next stage in the ring oscillator will be caused to transition, and the ring oscillator itself will start running at its designated frequency.

Upon the ring oscillator being enabled, the further capacitive component C1_b 479 is switched to being coupled between the output 424 of the inverter 420 and the ground plane 405, as illustrated in FIG. 5, resulting in the first and further capacitive component C1_a 477 and C1_b 479 being connected in parallel between the output 424 of the inverter 420 and the ground plane 405. Accordingly, when the ring oscillator is enabled and the further capacitive component C1_b 479 is switched to being coupled between the output 424 of the inverter 420 and the ground plane 405, the first and further capacitive component C1_a 477 and C1_b 479 may be treated as a single capacitance C1 475, where C1=C1_a+C1_b.

Figure 7:
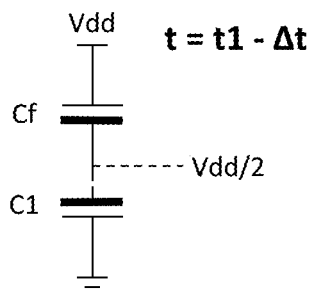

FIG. 7 schematically illustrates the voltages across the capacitances Cf 470 and C1 475 at time $t=t1-\Delta t$, where $\Delta t$ is a very small value. Accordingly, FIG. 7 illustrates the voltages across the capacitances Cf 470 and C1 475 shortly before the voltage level at the output 424 of the inverter 420 reaches the transition voltage for the next stage in the ring oscillator, and whilst the input 422 of the inverter 420 within the frequency tuning stage 400 is being driven at a logical '1' state by the preceding stage in the ring oscillator. As such, the voltage across both the capacitances Cf 470 and C1 475 will be Vdd (i.e. the logical '1' voltage level being driven by the preceding stage), and the voltage at the output 424 of the inverter 420 may be considered to be equal to the transition voltage, i.e. Vdd/2. Accordingly, at time $t=t1-\Delta t$, the voltage across each of the capacitances Cf 470 and C1 475 will be Vdd/2. Thus, the charge $Q_{Cf}$ within the flying capacitive element Cf 470 at time $t=t1-\Delta t$ may be defined as:

$$Q_{Cf} = C_f * \left(\frac{Vdd}{2} - Vdd\right) \quad \text{[Equation 1]}$$

and the charge $Q_{Cf}$ within the combined capacitive element C1 475 at time t=t1−Δt may be defined as:

$$Q_{C1} = C_1 * \left(\frac{Vdd}{2}\right) \quad \text{[Equation 2]}$$

Figure 8:
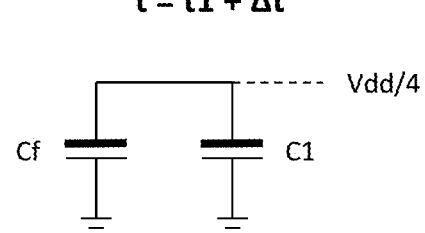

FIG. 8 illustrates the voltage across the capacitances Cf 470 and C1 475 at time t=t1+Δt. Accordingly, FIG. 8 illustrates the voltage across the capacitances Cf 470 and C1 475 shortly after the voltage level at the output 424 of the inverter 420 reaches the transition voltage for the next stage in the ring oscillator, and thus shortly after the input 422 of the inverter 420 within the frequency tuning stage 400 has been driven to a logical '0' state by the preceding stage in the ring oscillator. At time t=t1+Δt, it is assumed that the inverter 420 has had insufficient time to drive the voltage at its output 424 in response to the change of state at its input 422 (due to x being so small). As illustrated in FIG. 6, when the voltage level at the input 422 of the inverter 420 drops to 0V, the charge in the flying capacitance Cf 470 is required to cause a required oscillator voltage swing ΔV of Vdd/4 at the output 424 of the inverter 420. As will be appreciated by a person skilled in the art, the oscillator voltage swing ΔV is the initial change in voltage at the output of the inverter 420 upon a state transition during normal (stable) running of the ring oscillator, as indicated at 630 in FIG. 6. Accordingly, the voltage across each of the capacitances Cf 470 and C1 475 at time t=t1+Δt is required to be Vdd/4.

Thus, the charge $Q_{Cf}$ within the flying capacitive element Cf 470 at time t=t1+Δt may be defined as:

$$Q_{Cf} = C_f * \left(\frac{Vdd}{4}\right) \quad \text{[Equation 3]}$$

and the charge $Q_{C1}$ within the combined capacitive element C1 475 at time t=t1+Δt may be defined as:

$$Q_{C1} = C_1 * \left(\frac{Vdd}{4}\right) \quad \text{[Equation 4]}$$

Using charge conservation gives:

$$0 = \Delta Q_{Cf} + \Delta Q_{C1} \quad \text{[Equation 5]}$$

$$0 = Q_{Cf}(t_1+x) - Q_{Cf}(t_1-x) + Q_{C1}(t_1+x) - Q_{C1}(t_1-x) \quad \text{[Equation 6]}$$

$$0 = C_f * \left(\frac{Vdd}{4}\right) - C_f * \left(\frac{Vdd}{2} - Vdd\right) + C_1 * \left(\frac{Vdd}{4}\right) - C_1 * \left(\frac{Vdd}{2}\right) \quad \text{[Equation 7]}$$

$$C_1 = 3 * C_f \quad \text{[Equation 8]}$$

Thus, in order to achieve the required oscillator voltage swing ΔV of Vdd/4, the combined capacitive element C1 475 is required to be three times larger than the flying capacitive element Cf 470. For example, to achieve the following specification of:

an oscillating frequency of 1 MHz;
a duty cycle of 50%;
Vdd=2V;
Cf=1 pF; and
ΔV=Vdd/4 a combined capacitive element C1 475 of 3 pF is required. How this overall capacitance of the combined capacitive element C1 475 is split up between the individual capacitive components C1_a 477 and C1_b 479 must then be determined in order to minimise the delay in the ring oscillator running at its designated frequency upon being enabled.

FIG. 9 schematically illustrates the voltages across the capacitances Cf 470, C1_a 477 and C1_b 479 at time t=t0−Δt, i.e. just before the ring oscillator is enabled. As illustrated in FIG. 9, at time t=t0−Δt, in the illustrated example the input 422 of the inverter 420 is held at a logical '0' (i.e. 0V), and the inverter 420 drives a logical '1'(i.e. Vdd) at its output 424. As described above, when the ring oscillator is disabled, the further capacitive component C1_b 479 is coupled between the output 424 of the inverter 420 and the positive voltage source (Vdd 410). As such, the voltage across the flying capacitance Cf 470 and the first capacitive component C1_a 477 is Vdd at time t=t0−Δt, whilst voltage across the further capacitive component C1_b 479 is 0V at time t=t0−x. Thus, the charges $Q_{Cf}$, $Q_{C1\_a}$ and $Q_{C1\_b}$ within the flying capacitive element Cf 470, the first capacitive component C1_a 477 and the further capacitive component C1_b 479 respectively at time t=t0−Δt may be defined as:

$$Q_{Cf} = C_f * Vdd \quad \text{[Equation 9]}$$

$$Q_{C1\_a} = C_{1\_a} * Vdd \quad \text{[Equation 10]}$$

$$Q_{C1\_b} = 0 \quad \text{[Equation 11]}$$

FIG. 10 schematically illustrates the voltages across the capacitances Cf 470, C1_a 477 and C1_b 479 at time t=t0+Δt, i.e. just after the ring oscillator is enabled. As described above, when the ring oscillator is enabled, the further capacitive component C1_b 479 is coupled between the output 424 of the inverter 420 and ground. Furthermore, and as illustrated in FIG. 10, upon the ring oscillator being enabled, and the input 422 of the inverter 420 transitioning from a logical '0' to a logical '1', an oscillator voltage swing ΔV of Vdd/4 is required at the output 424 of the inverter 420 to enable the ring oscillator to run at its designated frequency without any delay. Accordingly, we want to achieve a voltage level at the output 424 of the inverter 420 of Vdd*¾ at time t=t0+Δt. Accordingly, the desired voltage across the flying capacitance Cf 470 is equal to the oscillator voltage swing ΔV of Vdd/4 at time t=t0+Δt, whilst the desired voltage across each of the first and further capacitive components C1_a 477 and C1_b 479 is equal to Vdd*¾ at time t=t0+Δt. Thus, the required charge $Q_{Cf}$ within the flying capacitive element Cf 470 at time t=t0+Δt may be defined as:

$$Q_{Cf} = C_f * \left(\frac{3}{4}Vdd - Vdd\right) \quad \text{[Equation 12]}$$

whilst the required combined charge $Q_{C1}$ within the capacitive components C1_a 477 and C1_b 479 at time t=t0+Δt may be defined as $$Q_{C1} = \frac{3}{4}Vdd(C_{1\_a} + C_{1\_b}) \quad \text{[Equation 13]}$$

Using charge conservation gives:

$$0 = \Delta Q_{Cf} + \Delta Q_{1\_a} + \Delta Q_{C1\_b}$$ [Equation 14]

$$\Delta Q_{Cf} = Q_{Cf}(t_0+x) - Q_{Cf}(t_0-x)$$ [Equation 15]

$$\Delta Q_{C1\_a} + \Delta Q_{C1\_b} = \tfrac{3}{4} Vdd(C_{1\_a} + C_{1\_b}) - C_{1\_a} * Vdd$$ [Equation 16]

We know from the required specification outlined above that Vdd=2V and Cf=1 pF. We also know from Equation 8 above that C1=3*Cf. Putting this information into Equations 14 to 16 gives the first capacitive component C1_a 477 as comprising a value of C1_a=1 pF and the further capacitive component C1_b 479 as comprising a value of C1_b=2 pF to achieve the desired oscillator voltage swing ΔV of Vdd/4 at the output 424 of the inverter 420 at time t=t0+Δt.

Thus, from the above it can be seen that, by splitting the capacitive element C1 475 arranged to operably couple the output 424 of the inverter 420 to a reference voltage when the ring oscillator is enabled, and coupling a part of the capacitive element C1 475 to, in the example illustrated in FIGS. 4 and 5, Vdd 410 when the ring oscillator is disabled, the aggregated charge stored within the capacitive loading of the delay element of the frequency tuning stage 400 may be regulated when the ring oscillator is disabled. Furthermore, by coupling the part of the capacitive element C1 475 to Vdd 410 when the ring oscillator is subsequently enabled, a redistribution of the (regulated) aggregated charge stored within the capacitive loading may be achieved that reduces, and potentially eliminates, overshoot/undershoot at the output of the inverter 420 of the frequency tuning stage 400. As a result, the delay between the ring oscillator being enabled and the time at which the ring oscillator starts running at its designated frequency may be significantly reduced, and potentially eliminated altogether.

Hence, and in accordance with some examples of the present invention, it is proposed that a ring oscillator circuit may be provided comprising a frequency tuning stage comprising an inverting logic gate and a delay component, the delay component comprising a first capacitive component, such as the first capacitive component C1_a 477 illustrated in FIGS. 4 and 5, comprising a first terminal operably coupled to an output of the inverting logic gate and a second terminal operably coupled to a first reference voltage, the first reference voltage comprising one of a high reference voltage and a low reference voltage. The delay component further comprises at least one further capacitive component, such as the further capacitive component C1_b 479 illustrated in FIGS. 4 and 5, comprising a first terminal operably coupled to the output of the inverting logic gate and a second terminal selectively couplable to the first reference voltage and a second reference voltage, the second reference voltage comprising the other of the high reference voltage and the low reference voltage. The second terminal of the at least one further capacitive component is arranged to be operably coupled to the first reference voltage when the ring oscillator is enabled, and operably coupled to the second reference voltage when the ring oscillator is disabled. In this manner, and as described above, the aggregated charge stored within the capacitive loading of the delay element of the frequency tuning stage may be regulated when the ring oscillator is disabled, and a redistribution of the (regulated) aggregated charge stored within the capacitive loading may be achieved that reduces, and potentially eliminates, overshoot/undershoot at the output of the inverting logic gate of the frequency tuning state. As a result, the delay between the ring oscillator being enabled and the time at which the ring oscillator starts running at its designated frequency may be significantly reduced, and potentially eliminated altogether.

FIG. 11 illustrates a simplified circuit diagram of an example of a ring oscillator circuit 1100 according to some embodiments of the present invention. In some examples, the ring oscillator circuit 1100 may be implemented within an integrated circuit device 1105 comprising at least one die within a single integrated circuit package. The ring oscillator circuit 1100 comprises a plurality of stages, 1110, 1120, 1130 operably coupled output-to-input in a ring configuration. It will be appreciated that such a ring oscillator circuit 1100 may comprise substantially any number of stages, whereby an odd number of stages comprise inverting stages arranged to drive their outputs to an inverted logical state received at their inputs. One of the stages of the ring oscillator circuit 1100 comprises a frequency tuning stage 1120. The frequency tuning stage 1120 comprises an inverter 1125 and a delay component. In the illustrated example, the delay element is implemented by way of a capacitive loading of an output 1124 of the inverter 1125 in conjunction with the limited ability of the output 1124 of the inverter 1125 to supply current. The capacitive loading of the output 1124 of the inverter 1125 comprises a first capacitive component 1177 comprising a first terminal 1180 operably coupled to the output 1124 of the inverter 1125 and a second terminal 1182 operably coupled to a first reference voltage, which in the illustrated example comprises a ground plane 1115. The capacitive loading of the output 1124 of the inverter 1125 comprises a further capacitive component 1179 comprising a first terminal 1184 operably coupled to the output 1124 of the inverter 1125 and a second terminal 1186 selectively couplable to the first reference voltage (i.e. ground 1115 in the illustrated example) and a second reference voltage, which in the illustrated example comprises a high voltage supply Vdd 1110.

In the example illustrated in FIG. 11, a first switching element 1150 is provided within the ring oscillator 1100 between an output 1134 of a final stage 1130 and an input 1112 of a first stage 1110 in the ring oscillator 1100. The first switching element 1150 is controlled by an enable signal 1160. The enable signal 1160 is arranged to configure the first switching element 1150 into a closed state (whereby the first switching element 1150 operably couples the output 1134 of the final stage 1130 to the input 1112 of the first stage 1110) when comprising a first logical state (e.g. a logical '1') and to configure the first switching element 1150 into an open state (whereby the first switching element 1150 isolates the output 1134 of the final stage 1130 from the input 1112 of the first stage 1110) when comprising a second logical state (e.g. a logical '0'). In this manner, the enable signal 1160 is used to enable and disable the ring oscillator 1100 by configuring the first switching element 1150 into a closed and open state respectively.

A second switching element 1155 is operably coupled between the input 1112 of the first stage 1110 and, in the illustrated circuit, ground 1115 providing a logical '0' reference state. The second switching element 1155 is also controlled by the enable signal 1160. The enable signal 1160 is arranged to configure the second switching element 1155 into an open state (whereby the second switching element 1155 isolates the input 1112 of the first stage 1110 from ground 1115) when comprising the first logical state (e.g. a logical '1') and to configure the second switching element 1155 into a closed state (whereby the second switching element 1155 operably couples the input 1112 of the first stage 1110 to ground 1115) when comprising the second logical state (e.g. a logical '0'). In this manner, the enable signal 1160 is arranged to operably couple the input 1112 of the first stage

1110 to ground 1115 when the ring oscillator 1100 is disabled in order to force the input 1112 of the first inverter 1110 to an initial (starting) logical '0' state.

In the example illustrated in FIG. 11, the delay component comprises a further switching element 1190 controllable to selectively couple the second terminal 1186 of the further capacitive component 1179 to the first reference voltage (i.e. ground 1115 in the illustrated example) and the second reference voltage (i.e. Vdd 1110 in the illustrated example). In the illustrated example, the further switching element 1190 is controlled by the enable signal 1160 such that when the enable signal 1160 is set to disable the ring oscillator circuit 1100, the further switching element 1190 is controlled to couple the second terminal 1186 of the further capacitive component 1179 to the second reference voltage (i.e. Vdd 1110 in the illustrated example). Conversely, when the enable signal 1160 is set to enable the ring oscillator circuit 1100, the further switching element 1190 is controlled to couple the second terminal 1186 of the further capacitive component 1179 to the first reference voltage (i.e. ground 1115 in the illustrated example).

In the illustrated example, the capacitive loading of the output 1124 of the inverter 1125 further comprises a flying capacitance 1170 comprising a first terminal 1172 operably coupled to the output 1124 of the inverter 1125 and a second terminal 1174 operably coupled to an 1122 input of the inverter 1125.

As described above with reference to FIGS. 4 to 10, the capacitive loading provided by the delay component is arranged such that, upon the ring oscillator circuit 1100 being enabled and the second terminal 1186 of the at least one further capacitive component 1179 being operably coupled to the first reference voltage (i.e. ground 1115) at time t=t0, a redistribution of charge within the capacitive components 1170, 1177, 1179 of the delay component at time t=t0+Δt achieves a voltage level at the output 1124 of the inverter 1125 equal to V_tr+/−ΔV, where V_tr is a transition voltage for the succeeding stage 1130 within the ring oscillator circuit 1100 and ΔV is an oscillator voltage swing for the ring oscillator circuit 1100.

Advantageously, the present invention is able to achieve the regulation of the charge within the capacitive loading operably coupled to the output 1124 of the inverter 1125 when the ring oscillator circuit 1100 is disabled without the need for directly coupling additional switches or the like to the output 1124 of the inverter 1125, whereby additional capacitance introduced by such additional switches at such a sensitive node within the ring oscillator circuit 1100 could have an adverse effect on the running frequency of the ring oscillator circuit 1100.

Figure 12:
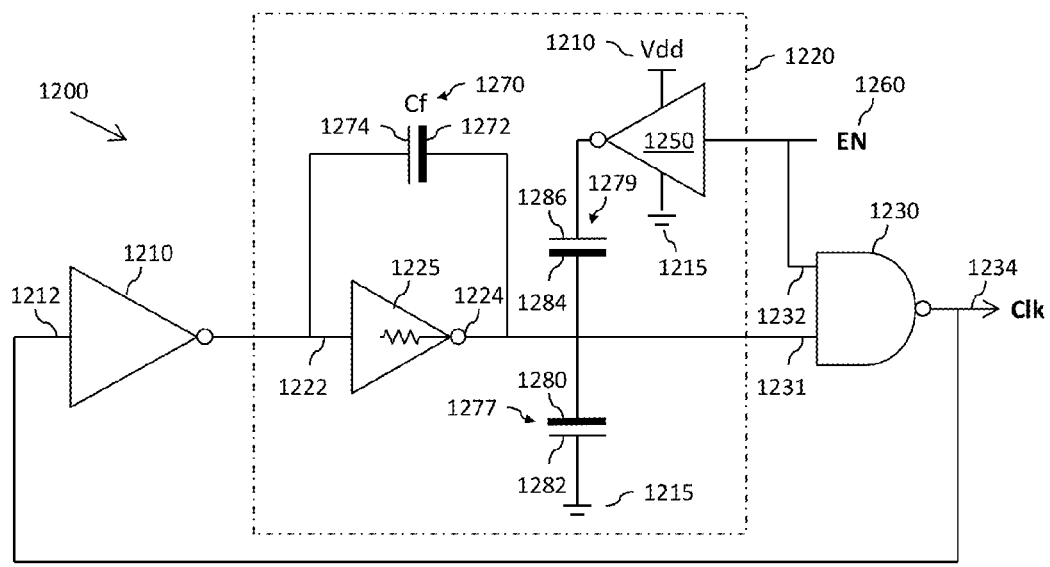
FIG. 12 illustrates a simplified circuit diagram of an alternative example of a ring oscillator circuit.

FIG. 12 illustrates a simplified circuit diagram of an example of a ring oscillator circuit 1200 according to some alternative embodiments of the present invention. The ring oscillator circuit 1200 comprises a plurality of stages, 1210, 1220, 1230 operably coupled output-to-input in a ring configuration. One of the stages of the ring oscillator circuit 1200 comprises a frequency tuning stage 1220. The frequency tuning stage 1220 comprises an inverter 1225 and a delay component. In the illustrated example, the delay element is implemented by way of a capacitive loading of an output 1224 of the inverter 1225 in conjunction with the limited ability of the output 1224 of the inverter 1225 to supply current. The capacitive loading of the output 1224 of the inverter 1225 comprises a first capacitive component 1277 comprising a first terminal 1280 operably coupled to the output 1224 of the inverter 1225 and a second terminal 1282 operably coupled to a first reference voltage, which in the illustrated example comprises a ground plane 1215. The capacitive loading of the output 1224 of the inverter 1225 comprises a further capacitive component 1279 comprising a first terminal 1284 operably coupled to the output 1224 of the inverter 1225 and a second terminal 1286 selectively couplable to the first reference voltage (i.e. ground 1215 in the illustrated example) and a second reference voltage, which in the illustrated example comprises a high voltage supply Vdd 1210.

In the example illustrated in FIG. 12, the second terminal 1286 of the further capacitive component 1279 is operably coupled to an output of a further logic gate 1250, which in the illustrated example comprises an inverter, the high voltage and low voltage supply rails for which are operably coupled to the high voltage supply Vdd 1210 and ground 1215 respectively. In this manner, when the inverter 1250 drives a logical '1' at its output, the second terminal 1286 of the further capacitive component 1279 is operably coupled to the high voltage supply Vdd 1210. Conversely, when the inverter 1250 drives a logical '0' at its output, the second terminal 1286 of the further capacitive component 1279 is operably coupled to ground 1215. An input of the inverter 1250 is operably coupled to an enable signal 1260 for the ring oscillator circuit 1200. It will be appreciated that the further logic gate 1250 may equally comprise alternative forms of logic gate. For example, a buffer may equally be implemented if non-opposing polarities are required between the input and output of the logic gate 1250.

In the example illustrated in FIG. 12, the final logic gate 1230 comprises a NAND logic gate. A first input 1231 of the NAND gate 1230 is operably coupled to the output 1224 of the inverter 1225 of the second stage 1220 of the ring oscillator circuit 1200. A second input 1232 of the NAND gate 1230 is operably coupled to the enable signal 1260. In this manner, when the enable signal 1260 is configured to comprise a logical '0', the output 1234 of the NAND gate 1230 is held at a logical '1', irrespective of the signal received at the first input 1231 of the NAND gate 1230. In this manner, the enable signal 1260 may be used to disable the ring oscillator 1200 by configuring the enable signal 1260 to comprise a logical '0'. Configuring the enable signal 160 to comprise a logical '0' also forces the input 1212 of the first inverter 1210 (operably coupled to the output 12 34 of the NAND gate 1230) to an initial (starting) logical state of a logical '1'. Furthermore, configuring the enable signal 1260 to comprise a logical '0' also causes the inverter 1250 to drive a logical '1' at its output, operably coupling the second terminal 1286 of the further capacitive component 1279 to the high voltage supply Vdd 1210.

Conversely, when the enable signal 1260 is configured to comprise a logical '1', the output 1234 of the NAND gate 1230 will comprise the inverse of the signal received at the first input 1231 of the NAND gate 1230, thereby enabling the ring oscillator 1200. Furthermore, configuring the enable signal 1260 to comprise a logical '1' also causes the inverter 1250 to drive a logical '0' at its output, operably coupling the second terminal 1286 of the further capacitive component 1279 to ground 1215.

In the illustrated example, the capacitive loading of the output 1224 of the inverter 1225 further comprises a flying capacitance 1270 comprising a first terminal 1272 operably coupled to the output 1224 of the inverter 1225 and a second terminal 1274 operably coupled to an 1222 input of the inverter 1225.

As described above with reference to FIGS. 4 to 10, the capacitive loading provided by the delay component is arranged such that, upon the ring oscillator circuit 1200 being enabled and the second terminal 1286 of the at least one further capacitive component 1279 being operably coupled to the first reference voltage (i.e. ground 1215) at time t=t0, a redistribution of charge within the capacitive components 1270, 1277, 1279 of the delay component at time t=t0+Δt achieves a voltage level at the output 1224 of the inverter 1225 equal to V_tr+/−ΔV, where V_tr is a transition voltage for the succeeding stage 1230 within the ring oscillator circuit 1200 and ΔV is an oscillator voltage swing for the ring oscillator circuit 1200.

Figure 13:
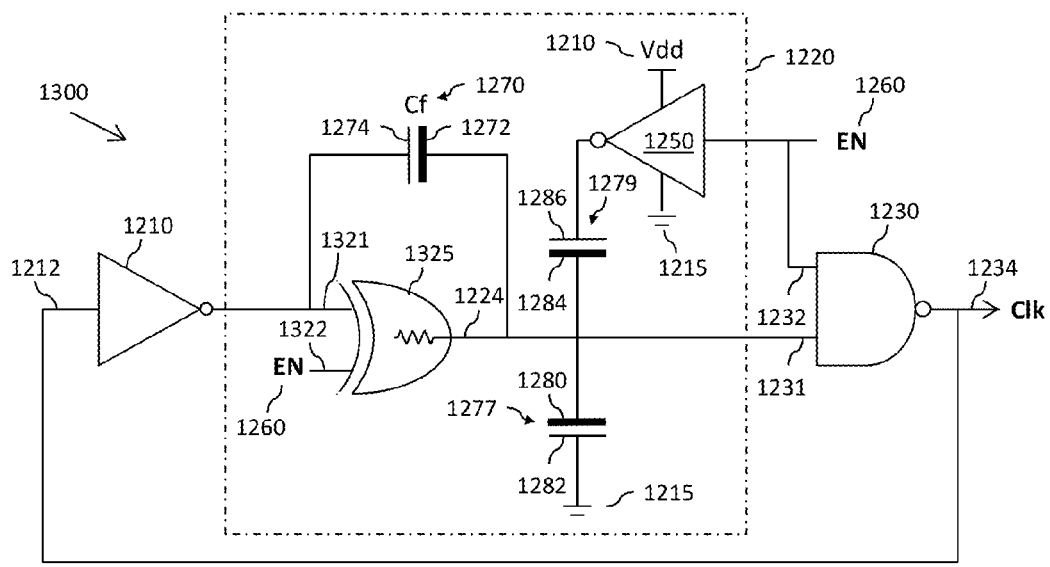
FIG. 13 illustrates a simplified circuit diagram of a further alternative example of a ring oscillator circuit.

FIG. 13 illustrates a simplified circuit diagram of an example of a ring oscillator circuit 1300 according to some further alternative embodiments of the present invention. The ring oscillator circuit 1300 is for the most part the same as the ring oscillator circuit 1200 illustrated in FIG. 12, and as such like features have been assigned the same reference numerals for simplicity and ease of understanding. Where the ring oscillator circuit 1300 illustrated in FIG. 13 differs from the ring oscillator circuit 1200 illustrated in FIG. 12 in that the frequency tuning stage 1220 comprises an eXclusive OR (XOR) gate 1325, instead of the inverter 1225. A first input 1321 of the XOR gate 1325 is operably coupled to the output of the preceding stage 1210 and to the second terminal 1274 of the flying capacitance 1270. A second input 1322 of the XOR gate 1325 is operably coupled to the enable signal 1260.

Figure 14:
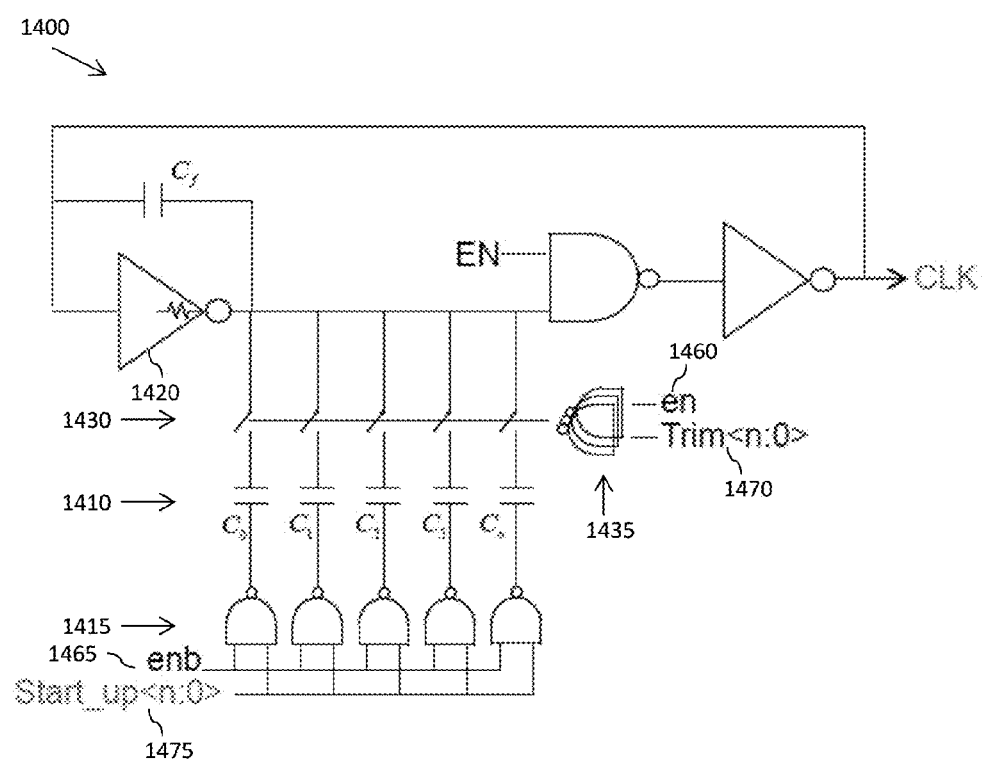
FIG. 14 illustrates a simplified circuit diagram of a still further alternative example of a ring oscillator circuit.

FIG. 14 illustrates a simplified circuit diagram of an example of a ring oscillator circuit 1400 according to some still further alternative embodiments of the present invention. In the example illustrated in FIG. 14, delay component comprises a trimmable capacitor configuration for implementing a capacitive loading of the output of an inverter 1420 within a frequency tuning stage of the ring oscillator circuit 1400, whereby an array of capacitance components, illustrated generally at 1410.

First terminals of the capacitance components 1410 are selectively coupled to the output of the inverter 1420 by an array of switching elements 1430. Each of the switching elements 1420 is controlled by an output signal of a NAND gate within a first set of NAND gates 1435. A first input of each of the NAND gates within the first set 1435 is operably coupled to an enable signal 1460 for the ring oscillator circuit 1400, whilst a second input of each of the NAND gates within the first set 1435 is operably coupled to a respective trim bit signal 1470. In this manner, the trim bit signals 1470 may be used to control the switches 1430 to operably couple selected capacitance components 1410 to include within the capacitive loading of the output of the inverter 1420 to 'trim' the running frequency of the ring oscillator 1400. Notably, when the ring oscillator circuit 1400 is disabled, all of the capacitance components 1410 are coupled to the output of the inverter 1420 to ensure all capacitance components 1410 are pre-charged whilst the ring oscillator circuit 1400 is disabled.

Second terminals of the capacitance components 1410 are operably coupled to an output signal of a NAND gate within a second set of NAND gates 1415. A first input of each of the NAND gates within the second set 1415 is operably coupled to an inverted enable signal 1465 for the ring oscillator circuit 1400, whilst a second input of each of the NAND gates within the second set 1415 is operably coupled to a respective startup bit signal 1475. In this manner, the startup bit signals 1475 may be used control how the capacitance components 1410 are pre-charged whilst the ring oscillator is disabled to regulate the aggregated charge stored within the capacitive loading to reduce, and potentially eliminate, overshoot/undershoot at the output of the inverter 1420 when the ring oscillator circuit is subsequently enabled.

Figure 15:
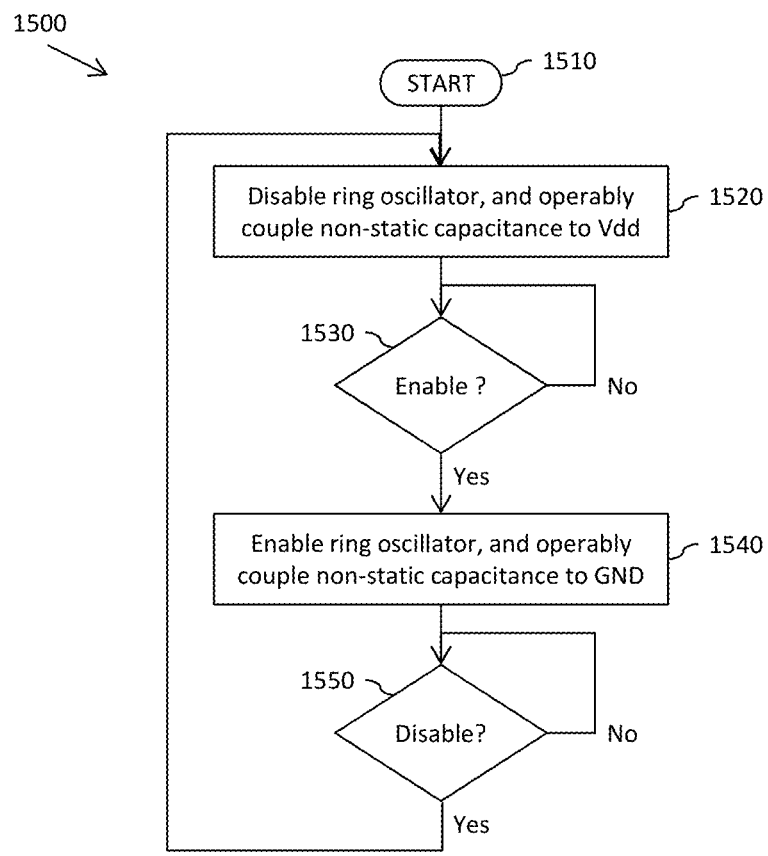
FIG. 15 illustrates a simplified flowchart of an example of a method of regulating an aggregate charge stored within a capacitive loading of a delay component for a frequency tuning stage of a ring oscillator circuit.

Referring now to FIG. 15, there is illustrated a simplified flowchart 1500 of an example of a method of regulating an aggregate charge stored within a capacitive loading of a delay component for a frequency tuning stage of a ring oscillator circuit, such as implemented in the ring oscillator circuits illustrated in FIGS. 11 to 13. As described above, the delay component comprises a first capacitive component comprising a first terminal operably coupled to an output of an inverting logic gate of the frequency tuning stage and a second terminal operably coupled to a first reference voltage, the first reference voltage comprising one of a high reference voltage and a low reference voltage. The delay component further comprises at least one further (non-static) capacitive component comprising a first terminal operably coupled to the output of the inverting logic gate and a second terminal selectively couplable to the first reference voltage and a second reference voltage, the second reference voltage comprising the other of the high reference voltage and the low reference voltage.

The method starts at 1510, and moves on to 1520 where the ring oscillator is disabled, and the second terminal of the at least one further (non-static) capacitive component is operably coupled to the first reference voltage, which in the illustrated example comprises ground. The method then waits until the ring oscillator circuit is to be disabled at 1550, when the method loops back to 1520.

In the illustrated examples, the delay elements of the frequency tuning stages have been illustrated and described as comprising an RC (resistance and capacitance) delay elements, with the resistance representing the fact that the output of this inverter is limited in terms of its ability to supply current. However, it will be appreciated that the delay element could equally be implemented by way of a current source in conjunction with capacitive loading.

In the various examples herein before described with reference to FIGS. 4 to 14, embodiments of the present invention have been described in which the capacitive element between the output of the inverting logic gate and, in the illustrated examples, ground has effectively been split, with part of the split capacitance being coupled to, in the illustrated examples, the high supply voltage Vdd when the ring oscillator circuit is disabled in order to regulate the aggregate charge within the capacitive loading on the output of the frequency tuning stage. However, it is contemplated that inventive concept could equally be applied to a flying capacitance, whereby the flying capacitive element is split, with part of the split capacitance being coupled to a voltage supply representative of the inverse of the logical signal at the input of the frequency tuning stage when the ring oscillator is disabled.

Figure 16:
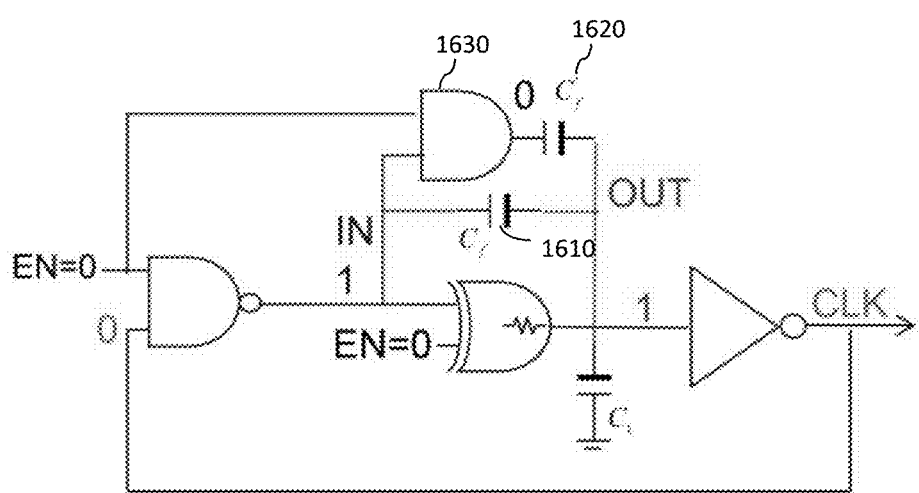
FIG. 16 illustrates a simplified circuit diagram of a still further alternative example of a ring oscillator circuit.

For example, and as illustrated in FIG. 16, a flying capacitance may be split into a first flying capacitance component 1610 operably coupled between the input and the output of the frequency tuning stage, and a second flying capacitance component 1620 operably coupled between the output of the frequency tuning stage and an output of an AND gate 1630. The input of the frequency tuning stage is held at a logical '1' when the ring oscillator is disabled, and the AND gate 1630 outputs a logical '0' to the second flying capacitance component 1620, thereby operably coupling the second flying capacitance component 1620 to ground, effectively the inverse of the logical '1' signal at the input of the frequency tuning stage, whilst the first flying capacitance component 1620 is operably coupled to Vdd provided by the logical '1' signal at the input of the frequency tuning stage. Proof of this concept of splitting the flying capacitance in this manner is provided in FIG. 17, illustrating that the inventive concept may equally be applied to a flying capacitance.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various

OTHER EMBODIMENTS

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A ring oscillator circuit comprising a plurality of stages operably coupled output-to-input in a ring configuration; at least one of the stages of the ring oscillator circuit comprises a frequency tuning stage, the at least one frequency tuning stage comprising an inverting logic gate and a delay component; the delay component comprising:

a first capacitive component comprising a first terminal operably coupled to an output of the inverting logic gate and a second terminal operably coupled to a first reference voltage at least when the ring oscillator is disabled, the first reference voltage comprising one of a high reference voltage and a low reference voltage; and at least one further capacitive component comprising a first terminal operably coupled to the output of the inverting logic gate and a second terminal selectively couplable to the first reference voltage and a second reference voltage, the second reference voltage comprising the other of the high reference voltage and the low reference voltage;

wherein the second terminal of the at least one further capacitive component is arranged to be operably coupled to the first reference voltage when the ring oscillator is enabled, and operably coupled to the second reference voltage when the ring oscillator is disabled.

2. The ring oscillator circuit of claim 1, wherein the delay component is arranged such that, upon the ring oscillator circuit being enabled and the second terminal of the at least one further capacitive component being operably coupled to the first reference voltage at time t=t0, a redistribution of charge within the capacitive components of the delay component at time t=t0+Δt achieves a voltage level at the output of the inverting logic gate equal to $V\_tr +/- \Delta V$, where $V\_tr$ is a transition voltage for the succeeding stage within the ring oscillator circuit and ΔV is an oscillator voltage swing for the ring oscillator circuit.

3. The ring oscillator circuit of claim 1, wherein the delay component comprises a switching element controllable to selectively couple the second terminal of the at least one further capacitive component to the first reference voltage and the second reference voltage.

4. The ring oscillator circuit of claim 3, wherein the switching element is controlled by an enable signal for the ring oscillator circuit such that:
   when the enable signal is set to disable the ring oscillator circuit, the switching element is controlled to couple the second terminal of the further capacitive component to the second reference voltage; and
   when the enable signal is set to enable the ring oscillator circuit, the switching element is configured to couple the second terminal of the further capacitive component to the first reference voltage.

5. The ring oscillator circuit of claim 1, wherein the second terminal of the at least one further capacitive component is operably coupled to an output of a further logic gate.

6. The ring oscillator circuit of claim 5, wherein an input of the further logic gate is operably coupled to an enable signal for the ring oscillator circuit.

7. The ring oscillator circuit of claim 5, wherein the further logic gate comprises one of an inverter and a buffer.

8. The ring oscillator circuit of claim 1, wherein the second terminal of the first capacitive component is operably coupled to the first reference voltage when the ring oscillator is disabled and when the ring oscillator is enabled.

9. The ring oscillator circuit of claim 1, wherein the delay component further comprises a flying capacitance comprising a first terminal operably coupled to the output of the inverting logic gate and a second terminal operably coupled to an input of the inverting logic gate.

10. The ring oscillator circuit of claim 1, wherein the first capacitive component comprises a flying capacitance, and the second terminal of the first capacitive component is operably coupled to an input of the first capacitive component.

11. The ring oscillator circuit of claim 10, wherein the delay component further comprises a still further capacitive component comprising a first terminal operably coupled to the output of the inverting logic gate and a second terminal operably coupled to one of the first reference voltage and the second reference voltage when the ring oscillator is disabled and when the ring oscillator is enabled.

12. The ring oscillator circuit of claim 1, wherein the first and second reference voltages comprise supply voltages.

13. The ring oscillator circuit of claim 1, wherein the first reference voltage comprises a ground plane.

14. The ring oscillator circuit of claim 1, wherein the second reference voltage comprises a positive supply voltage.

15. The ring oscillator circuit of claim 1, wherein the inverting logic gate comprises one of an inverter and an exclusive OR gate.

16. The ring oscillator circuit of claim 1, implemented within an integrated circuit device comprising at least one die within a single integrated circuit package.

17. A method of regulating an aggregate charge stored within a capacitive loading of a delay component for a frequency tuning stage of a ring oscillator circuit, the delay component comprising:
   a first capacitive component comprising a first terminal operably coupled to an output of an inverting logic gate of the frequency tuning stage and a second terminal operably coupled to a first reference voltage at least when the ring oscillator is disabled, the first reference voltage comprising one of a high reference voltage and a low reference voltage; and
   at least one further capacitive component comprising a first terminal operably coupled to the output of the inverting logic gate and a second terminal selectively couplable to the first reference voltage and a second reference voltage, the second reference voltage comprising the other of the high reference voltage and the low reference voltage;
wherein the method comprises:
   operably coupling the second terminal of the at least one further capacitive component to the second reference voltage when the ring oscillator is disabled; and
   operably coupling the second terminal of the at least one further capacitive component to the first reference voltage upon the ring oscillator being enabled.

* * * * *